(12) United States Patent
Takagi et al.

(10) Patent No.: US 6,244,754 B1
(45) Date of Patent: Jun. 12, 2001

(54) SEMICONDUCTOR LASER MODULE AND METHOD OF MANUFACTURING THE SAME

(75) Inventors: Toshio Takagi; Takashi Kato, both of Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/280,993

(22) Filed: Mar. 30, 1999

(30) Foreign Application Priority Data

Mar. 30, 1998 (JP) .................................................. 10-102160

(51) Int. Cl.⁷ ........................................................ G02B 6/42
(52) U.S. Cl. .................................................. 385/88; 385/91
(58) Field of Search .................................. 385/88, 89, 91, 385/92, 94

(56) References Cited

U.S. PATENT DOCUMENTS 5,221,170    6/1993    Duffy et al. .
5,717,804    2/1998    Pan et al. .

FOREIGN PATENT DOCUMENTS

| 0 259 018 | 3/1988 | (EP) . |
| 0 587 895 | 3/1994 | (EP) . |
| 1-71193 | 3/1989 | (JP) . |
| 4-240607 | 8/1992 | (JP) . |
| 6-12369 | 2/1994 | (JP) . |
| WO 89 06816 | * 7/1989 | (WO) ................................ G02B/6/42 |

* cited by examiner

*Primary Examiner*—Frank G. Font
*Assistant Examiner*—Andrew H. Lee
(74) *Attorney, Agent, or Firm*—McDermott, Will & Emery

(57) ABSTRACT

In a semiconductor laser module which contains a semiconductor laser 31 installed in a package 10 with an optical fiber 21 is fixed through support members 41, 43 to a submount 30 on which the semiconductor laser 31 is mounted. A ferrule 21 is fixed to the support members 41, 43 at first portion close to the leading end of the ferrule 21 and second portion apart forn the leading end of the ferrule 21. The support members 41, 43 and the ferrule 21 are not contact with the package 10 but placed in the same temperature condition as that of the semiconductor laser 31.

10 Claims, 3 Drawing Sheets

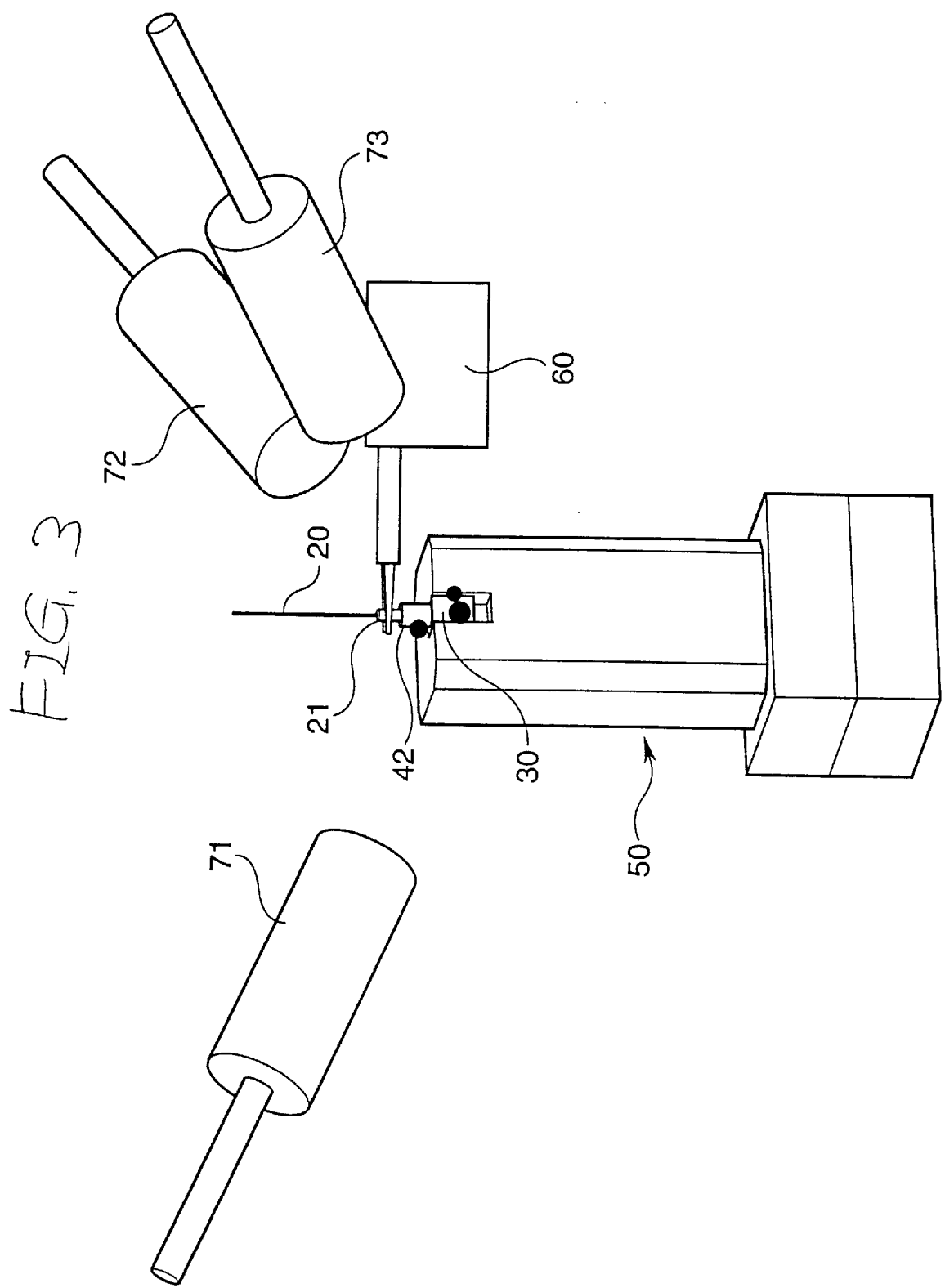

SEMICONDUCTOR LASER MODULE AND METHOD OF MANUFACTURING THE SAME

BACKGROUND OF THE INVENTION

1. Field of the Invention

The present invention relates to a semiconductor laser module. More particularly, the invention relates to a semiconductor laser module structure which is formed by integrating a semiconductor laser as a light source with an optical fiber as an optical waveguide and to a method of manufacturing such a semiconductor laser module.

2. Description of the Related Art

A typical semiconductor laser module is basically formed by integrating a semiconductor laser such as an Laser Diode (LD) which is an electro-optical conversion element with an optical fiber for efficiently propagating the laser light. In a semiconductor laser module, the relative position between the light emitting surface of the semiconductor laser and the incident end of the optical fiber must be accurately aligned to improve the optical coupling efficiency. Optical cavity is defined by the distance between two edge surface in ordinal semiconductor laser and the cavity length is just equal to the dimension of the semiconductor laser chip. On the other hand, it is defined by the distance between the grating formed in the core region of the optical fiber and the edge surface which is not facing to the optical fiber. In such an optical module, it will take longer time than the semiconductor laser itself from carrier injection into the cavity to generating a coherent light and deteriorate the high frequency performance of the optical module. In order to improve the performance at high frequency, it is desirable to couple the semiconductor laser directly to the optical fiber without inserting any optical members between them. Conventional semiconductor laser module mentioned above are described in, for example, U.S. Pat. No. 5,221,170.

The semiconductor laser module disclosed in that patent has a boxlike package. A ferrule is passed through one of the sidewalls of the package and fixed thereat. The grating is formed in the core region of the optical fiber protected by the ferrule. When the ferrule is thus fixed, it is precisely positioned so that a semiconductor laser and an optical fiber are efficiently coupled. In this semiconductor laser module, moreover, the ferrule is fixedly supported on its leading and rear end sides. Fine aligniment can readily be carried out by utilizing a length of the ferrule as a lever with a fixed point close to the leading end as a fulcrum.

The laser module mentioned above are subjected to a high order of alignment accuracy during the production. However, the desired performance such as optical coupling efficiency may not be always available when the laser module is installed in a system. Lowering of optical output power not relating to the deterioration of a semiconductor laser chip itself may occur. The conventional laser module has been so structured as to secure each of the members for supporting a ferrule to the wall surface of a package. Misalignment may occur because it can not avoid physical distortion by the stress induced at the packaging of the module and the temperature change in a operating even if precisely adjustment is attained at the production. A wavelength shift of the emitted light may also occur because the light reflection characteristics of the grating depends on the modulation interval of the refractive index in the grating and its absolute value. The stress applied to the package changes the modulation interval and the temperature change affects the refractive index of the grating.

A method of manufacturing the conventional semiconductor laser module has comprised the steps of securing each support member to the wall surface of the package and then fixing the ferrule to the support members. In order to pass the ferrule through these support members, however, the inner diameters of the through-holes formed in the respective support members must be greater than the outer diameter of the ferrule. Fine adjustment has been difficult because a aligning tolerance of the ferrule is too large.

SUMMARY OF THE INVENTION

An object of the present invention intended to solve the foregoing problems is to provide a semiconductor laser module so structured as to reduce performance deterioration due to a physical arrangement between a semiconductor laser and an optical fiber.

Another object of the present invention is to provide a method of manufacturing such a semiconductor laser module.

To achieve the above objects, a semiconductor laser module according to the present invention is formed by integrating a semiconductor laser contained in a package with an optical fiber and comprises: a ferrule in to which the light incident end of the optical fiber is inserted; a submount including a horizontal portion for supporting the semiconductor laser and a vertical portion perpendicularly raised from the horizontal portion in such a manner as to cross an optical path, whereupon a through-hole having an inner diameter sufficiently greater than the outer diameter of the ferrule is provided in the vertical portion so that the ferrule can be inserted into the through-hole; a first support member provided with a through-hole whose inner diameter is substantially equal to the outer diameter of the ferrule and mounted close to the leading end of the ferrule; and a second support member provided with a through-hole whose inner diameter is substantially equal to the outer diameter of the ferrule and mounted close to the rear end of the ferrule, wherein the ferrule whose leading end has been inserted into the through-hole in the vertical portion is fixed to and supported by the submount via the first support member close to the leading end and via the second support member close to the rear end thereof.

According to the preferred embodiment of the invention, it is preferable that the semiconductor laser module further comprises an extension member which is cylindrical having an inner diameter sufficiently greater than the outer diameter of the ferrule. One end of the extension member is fixed to the vertical portion of the submount, wherein the second support member is fixed to the vertical portion of the submount via the extension member.

A method of manufacturing the aforesaid semiconductor laser module comprises the steps of:

(1) passing the ferrule through each of the through-holes in the second support member, the extension member and the first support member and fixing the first support member close to the leading end of the ferrule;

(2) aligning the semiconductor laser installed in a horizontal portion of the submount with the optical fiber so as to optically couple to each other and fixing the first support member to the submount;

(3) fixing the extension member to the vertical portion of the submount;

(4) fixing the second support member close to the rear end of the ferrule; and (5) aligning the semiconductor laser and the optical fiber again and then fixing the second support member to the extension member.

The "aligning" in the aforesaid method of manufacturing the semiconductor laser module means that the mutual position and the angle between the semiconductor laser and the light incident end of the optical fiber are adjusted to couple the semiconductor laser to the optical fiber with the maximum efficiency.

A semiconductor laser module according to the present invention is provided with a ferrule fixed to the submount, which is the most important feature. The ferrule which is fixed in such a configuration is separated completely from the package. The positioning of the ferrule as well as the aligning of an optical fiber is set free from the stress applied to the package.

According to a preferred embodiment of the invention, the submount is fixed to the package via a temperature control element such as a Peltier element. With this arrangement, not only a semiconductor laser but also the whole member including the submount and the ferrule is affected by the Peltier element. The misalignment and the wavelength shift of emitted light due to temperature change in environment hardly occurs. Each of the members such as the submount and the ferrule is preferably made of metal. Moreover, it is preferable that those members are thermally coupled together by YAG welding.

Although the following description of the invention given in detail with reference to the drawings, it is not intended to limit the scope of the present invention thereto.

BRIEF DESCRIPTION OF THE DRAWINGS

FIG. 3 is an exemplary diagram illustrating a structural example of equipment usable for the work of fabricating the semiconductor laser according to the present invention.

DETAILED DESCRIPTION OF THE PREFERRED EMBODIMENTS

A description will be given in more detail of preferred embodiments of the present invention with reference to the accompanying drawings.

Figure 1:
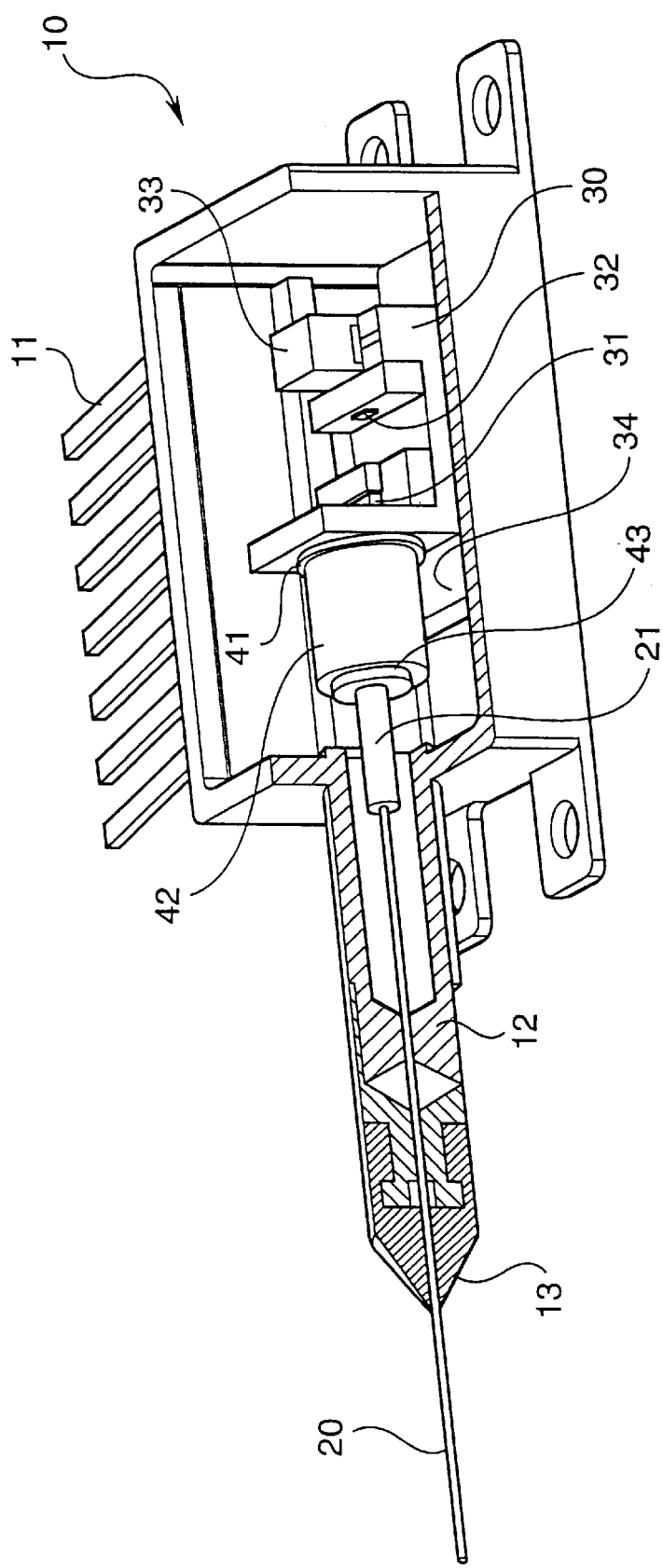
FIG. 1 is a partial cutaway view showing an example of the specific structure of a semiconductor laser module according to the present invention.

FIG. 1 is a partial cut way perspective view showing an example of the specific structure of a semiconductor laser module according to the present invention.

This semiconductor laser module has a so-called butterfly-type package 10 made of KOVAR. The principal portion of the package 10 is substantially cubic and a plurality of lead pins 11 for electrical connections are extended to one side. The package 10 employed in this embodiment has dimensions of 21 mm×13 mm×9 mm.

A cylindrical portion 12 is provided on the left-hand sidewall of the package 10. A protection cover 13 made of flexible material is attached at the tip of the cylindrical portion 12. An optical fiber 20 is extended outside through the portion 12 and the cover 13. The rear end of the ferrule 21 is not in contact with any portion of the package. The surface of the optical fiber 20 is plated with gold and fixedly soldered to the portion 12.

The fiber 20 is slightly warped in the package; therefore, the stress applied to the package is prevented from affecting the inside members of the package 10. The grating 22 is formed in the core region of the optical fiber protected by the ferrule 21.

Figure 2:
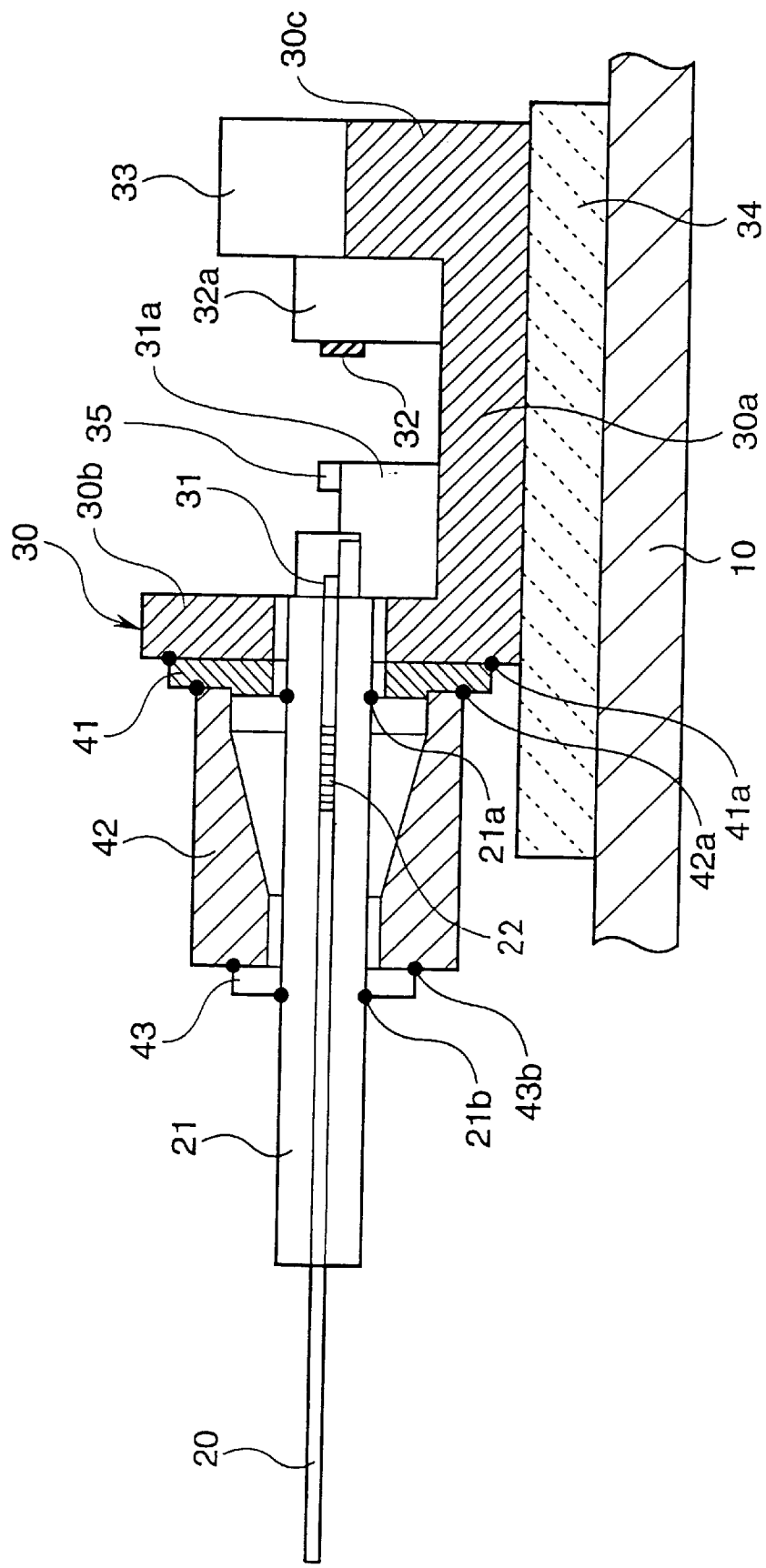
FIG. 2 is an enlarged vertical sectional view of the inner structure of the semiconductor laser module shown in FIG. 1.

FIG. 2 is an enlarged vertical sectional view of the structure and members contained in the package of the laser module. As shown in FIG. 2, a Peltier element 34 for a temperature control element is directly fixed to the base of the package 10. A submount 30 is mounted on the Peltier element 34. The submount 30 is such that the front and rear ends of its horizontal portion 30a which is in contact with the Peltier element 34 are extended upright to form vertical portions 30b, 30c. A semiconductor laser 31, a thermistor element 35 and a monitoring photodiode 32 are installed via insulation chip carriers 31a, 32a on the horizontal portion 30a. An inductor element 33 is put on the top of the vertical portion 30c in the rear end side. The thermistor 35 is used as a temperature detection element. The operation of the semiconductor laser can be stabilized by feeding the output signal of the thermistor 35 back to the Peltier element 34. The semiconductor laser 31 is installed in a manner that the epitaxial growth layer is placed on the upper side. The submount 30 is fixedly soldered to the top of the Peltier element 34. The corner of the chip carrier 31a is chamfered so that the excess solder between the horizontal portion and the chip carrier 31a can escape thereinto. The through-hole whose diameter is greater than the outer diameter of the ferrule 21 is formed in the front-side vertical portion 30b of the submount 30. The semiconductor laser 31 and the optical fiber 20 are optically coupled by inserting the ferrule 21 holding the light incident end of the optical fiber 20 into the through-hole from the outside of the submount 30.

A ring-like first support member 41 for supporting the ferrule at the portion close to the leading end thereof is fixed by YAG welding to the outer surface of the front-side vertical portion 30b at a plurality of fix-points 41a on the outer periphery of the support member 41. The inner diameter of the first support member 41 is substantially equal to the outer diameter of the ferrule 21.

The extension member 42 is generally cylindrical and has an inner diameter sufficiently large to have the ferrule 21 inserted thereinto. One end of the extension member 42 is fixed by YAG welding to the first support member 41 at plurality of outer peripheral fixed points 42a.

The second support member 43 is fixed to the edge face of the other end of the extension member 42. The through-hole through which the ferule can be inserted is also formed in the second support member 43. The second support member 43 is fixed by YAG welding to the extension member 42 at a plurality of outer peripheral fix-points 43a.

The ferrule 21 is fixed to the first and the second support members 41, 43 at the portions close to the leading and rear ends of the ferrule; in other words, the ferrule 21 is fixed to the first support member 41 at fix-points 21a which are close to the leading end of the ferrule 21, whereas it is also fixed to the second support member 43 at fix-points 21b close to the rear end of the ferrule 21.

With the aforesaid arrangement, there is a portion of the optical fiber 20 which is not covered with the ferrule 21 between the outside of the package 10 and the rear end of the ferrule 21. As the optical fiber itself is flexible, no stress affects the structure within the package 10. On the other hand, in a conventional semiconductor laser module, the stress caused to the package influences the inside of the package because one end of the ferrule is directly fixed to its package. In such a module, the coupling efficiency is reduced at the actual use even if precise aligning is made at its production.

According to the present invention, the assembly including the submount 30, the ferrule 21, the support members 41, 43, the extension member 42 and the like is separated form the package 10, whereas these members are integrally mounted on the Pelitier element 34. Since these members are made of metal and welded to one another, the heat conductance and heat transfer are effective and the operating temperature is readily controlled by the Peltier element 34. Thus, misalignment and the wavelength shift of the emitted light due to temperature fluctuation can be substantially prevented. It is preferable to select a Peltier element 34 having a control capacity greater than what is fit for only the semiconductor laser 31. It is also preferable to use a large Peltier element 34 such that the Peltier element is not only placed beneath the submount 30 but extended under the members 41, 42, 43.

FIG. 3 is an exemplary diagram illustrating a structural example of equipment for manufacturing this semiconductor laser module. The equipment comprises an X-Y stage 50 having a chuck on top of the stage and a Z stage 60 for precisely adjusting a position relative to the member held by the X-Y stage 50. A plurality of YAG laser tubes 71, 72, 73 are arranged around the X-Y stage 50 so that the members can be welded by YAG laser. There is also provided an instrument which monitors the light emitted from the semiconductor laser 31 via the optical fiber 20.

The semiconductor laser module shown in FIGS. 1 and 2 is constructed by the following steps. The ferrule 21 is passed through the respective through-holes of the second support member, the extension member 42, and the first support member 41 in this order. The ferrule 21 is aligned with respect to the semiconductor laser 31 and positioned so as to optimize the space between the ferrule 21 and the semiconductor laser 31. Subsequently, the first support member 41 is fixed close to the leading end of the ferrule 21. The leading end of the ferrule 21 is passed through the through-hole of the vertical portion of the submount 30, and the ferrule 21 is aligned by monitoring the light emitted from the semiconductor laser 31 through the optical fiber 20. After the positioning of the ferrule 21 is completed, the first support member 41 is fixed to the submount by YAG welding. The second support member 43 is mounted on and fixed to the ferrule 21 after the extension member 42 has been fixed to the vertical portion of the submount 30. Finally, the semiconductor laser 31 and the optical fiber 20 are aligned again before the second support member 43 is fixed to the extension member 42.

In the series of the steps aforesaid, any misalignment that has occurred when the first support member is welded to the vertical portion of the submount 30 can be corrected before the second support member is welded to the far-side fix-points 43*a*. The displacement of the leading end of the ferrule 21 is reduced by the lever action with the fixed points 21*a* as a fulcrum. The fix-points close to the rear end of the ferrule 21*b*, the fix-points close to the leading end of the ferrule 21*a*, and the leading end of the ferrule act for the lever action with the points 21*a* as a fulcrum. The displacement of the leading end of the ferrule 21 is suppressed even when the second support member is slid tolerably on the edge surface of the extension member. The amount of the displacement of the leading end of the ferrule depends on both the distance between the leading end of the ferrule and the fixed points 21*a* and the distance between the fixed points 21*b* and the fixed points 21*a*. Precise alignment between the leading end of the ferrule and the semiconductor laser 31 is possible by setting the latter distance sufficiently longer than the former.

As set forth above, the semiconductor laser module according to the present invention is adapted to effectively shut off the influence of the stress applied to the package as well as the ambient temperature fluctuation. It can minimize the misalignment by employing a unique structure in which the ferrule is fixed to the submount installed in the package. The wavelength shift of the emitted light can be also avoided. The semiconductor laser module according to the present invention can be widely used as an electro-optical interface maintaining initial performance.

What is claimed is:

1. A semiconductor laser module containing a semiconductor laser and an optical fiber with the light incident end thereof optically coupled to said semiconductor laser in a package, said semiconductor laser module comprising:

a ferrule having a leading end opposing said semiconductor laser and a rear end, said ferrule supporting said light incident end of said optical fiber;

a submount including:
      a horizontal portion for supporting said semiconductor laser, and
      a vertical portion perpendicularly raised from said horizontal portion and having a through-hole with an inner diameter sufficiently greater than outer diameter of said ferrule, said ferrule being inserted into said through-hole;

a first support member having a through-hole with an inner diameter substantially equal to the outer diameter of said ferrule;

a second support member having a through-hole with an inner diameter substantially equal to the outer diameter of said ferrule; and a cylindrical extension member for securing said second support member to said vertical portion of said submount wherein;
      said ferrule, said submount, said first support member, said second support member, and said cylindrical extension member are contained in said package,
      said ferrule is fixed to said submount through said first support member at a first portion close to said leading end of said ferrule, and
      said ferrule is fixed to said submount through said second support member at a second portion close to said rear end of said ferrule.

2. A semiconductor laser module according to claim 1, wherein distance between said first portion and said second portion is longer than the distance between said first portion and said leading end of said ferrule.

3. A semiconductor laser module according to claim 1, wherein said extension member has a cylindrical form.

4. A semiconductor laser module according to claim 1, wherein said ferrule, said submount, said first support member, said second support member, and said extension member are made of metal and
   wherein these members are fixed to one another by YAG welding.

5. A semiconductor laser module according to claim 1, wherein said ferrule, said submount, said first support member, said second support member, and said extension member are not in contact with said package.

6. A semiconductor laser module according to claim 1, wherein said submount is mounted on a temperature control element.

7. A semiconductor laser module according to claim 1, wherein a diffraction grating is formed in said optical fiber, said diffraction grating being contained in said package.

8. A method of manufacturing a semiconductor laser module containing a semiconductor laser and an optical fiber with the light incident end thereof optically coupled to said semiconductor laser in a package, said module comprising:

a ferrule having a leading end opposing to said semiconductor laser and a rear end, said ferrule supporting said light incident end of said optical fiber;

a submount including:
- a horizontal portion for supporting said semiconductor laser, and
- a vertical portion perpendicularly raised from said horizontal portion and having a through-hole with an inner diameter sufficiently greater than outer diameter of said ferrule, said ferrule being inserted into said through-hole;

a first support member having a through-hole with an inner diameter substantially equal to the outer diameter of said ferrule;

a cylindrical extension member having a through-hole with an inner diameter sufficiently greater than the outer diameter of said ferrule; and a second support member having a through-hole with an inner diameter substantially equal to the outer diameter of said ferrule, wherein said ferrule, said submount, said first support member, said second support member, and said extension member are contained in said package, said method comprising of the steps:
- passing said ferrule through each of said through-holes in said second support member, said extension member, and said first support member;
- fixing said first support member at a first portion close to said leading end of said ferrule;
- aligning said optical fiber to said semiconductor laser so as to optically couple said light incident end of said optical fiber to said semiconductor laser;
- fixing said first support member to said vertical portion of said submount;
- fixing said extension member to said submount;
- fixing said second support member to a second portion close to said rear end of said ferrule;
- aligning said optical fiber to said semiconductor laser again; and
- fixing said second support member to said extension member.

9. A method of manufacturing a semiconductor laser module according to claim 8, wherein distance between said first portion and said second portion is longer than the distance between said first portion and said leading end of said ferrule.

10. A method of manufacturing a semiconductor laser module according to claim 8, wherein said ferrule, said submount, said first support member, said extension member, and said second support member are made of metal and
wherein these members are fixed to one another by YAG welding.

* * * * *